(12) United States Patent
Chowdhury et al.

(10) Patent No.: US 10,469,076 B2
(45) Date of Patent: Nov. 5, 2019

(54) POWER GATING CIRCUIT UTILIZING DOUBLE-GATE FULLY DEPLETED SILICON-ON-INSULATOR TRANSISTOR

(71) Applicants: Masud H. Chowdhury, Lees Summit, MO (US); Emesahw Ashenafi, Kansas City, MO (US)

(72) Inventors: Masud H. Chowdhury, Lees Summit, MO (US); Emesahw Ashenafi, Kansas City, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 15/816,766

(22) Filed: Nov. 17, 2017

(65) Prior Publication Data

US 2018/0145685 A1     May 24, 2018

Related U.S. Application Data

(60) Provisional application No. 62/425,347, filed on Nov. 22, 2016.

(51) Int. Cl.
    *H03K 17/687*      (2006.01)
    *H03K 19/00*        (2006.01)

(52) U.S. Cl.
    CPC ........... *H03K 17/687* (2013.01); *H03K 19/00* (2013.01); *H03K 2017/6875* (2013.01)

(58) Field of Classification Search
    CPC ............................................. H03K 2017/6878
    See application file for complete search history.

(56) References Cited

U.S. PATENT DOCUMENTS

| | | | |
|---|---|---|---|
| 5,164,805 A | 11/1992 | Lee | |
| 5,610,533 A * | 3/1997 | Arimoto | H01L 27/0218 326/33 |
| 5,821,769 A | 10/1998 | Douseki | |
| 6,046,627 A * | 4/2000 | Itoh | G11C 5/146 257/E27.062 |
| 6,097,113 A * | 8/2000 | Teraoka | H01L 27/092 257/E27.062 |
| 6,166,584 A * | 12/2000 | De | H01L 27/0928 257/E27.067 |
| 6,466,077 B1 * | 10/2002 | Miyazaki | G05F 3/205 326/33 |
| 6,949,777 B2 * | 9/2005 | Hayashi | H01L 21/84 257/213 |
| 7,112,997 B1 * | 9/2006 | Liang | G06F 17/5054 257/E21.703 |
| 7,385,436 B2 * | 6/2008 | Itoh | H01L 21/84 257/E21.415 |
| 7,750,682 B2 * | 7/2010 | Bernstein | H03K 19/0008 326/122 |

(Continued)

OTHER PUBLICATIONS

International Search Report and Written Opinion of related application PCT/US2017/62459 filed Nov. 20, 2017, dated Mar. 5, 2018, 12 pages.

*Primary Examiner* — Jeffery S Zweizig
(74) *Attorney, Agent, or Firm* — Stinson LLP

(57) ABSTRACT

Combining the functionality of sleep transistors with logic devices in power-gating circuits by utilizing fully depleted silicon-on-insulator (FDSOI) transistors. In an embodiment, a back gate of a FDSOI transistor controls the threshold voltage to eliminate the need for standalone sleep transistors.

22 Claims, 11 Drawing Sheets

(56) References Cited

U.S. PATENT DOCUMENTS

| | | | |
|---|---|---|---|
| 8,384,425 B2* | 2/2013 | Mazure | H01L 21/84 257/347 |
| 8,575,699 B2* | 11/2013 | Chan | H01L 21/7624 257/347 |
| 9,479,168 B2* | 10/2016 | Giraud | H03K 19/0016 |
| 2003/0067321 A1 | 4/2003 | Turner | |
| 2005/0037582 A1 | 2/2005 | Dennard et al. | |
| 2008/0239789 A1 | 10/2008 | Shino et al. | |
| 2011/0133776 A1 | 6/2011 | Mazure et al. | |
| 2016/0079127 A1 | 3/2016 | Hook et al. | |

* cited by examiner

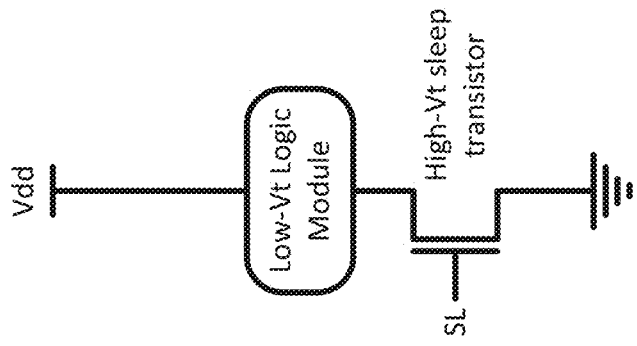
PRIOR ART
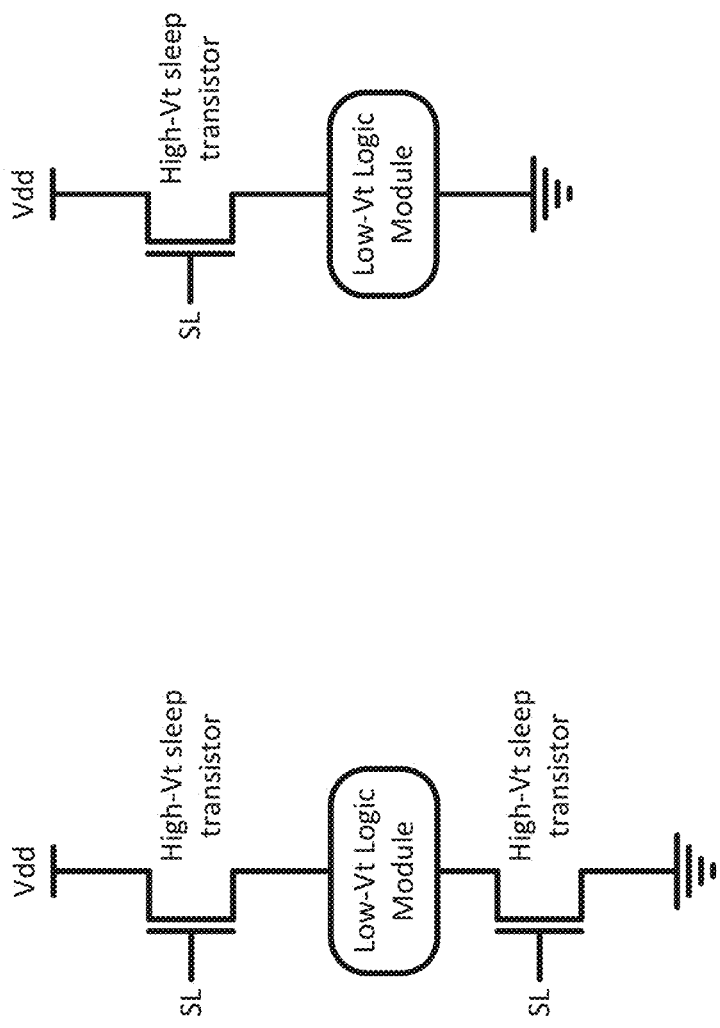
FIG. 1C
FIG. 1B
FIG. 1A

POWER GATING CIRCUIT UTILIZING DOUBLE-GATE FULLY DEPLETED SILICON-ON-INSULATOR TRANSISTOR

CROSS-REFERENCE TO RELATED APPLICATION

This application claims priority from U.S. Provisional Patent Application No. 62/425,347, filed Nov. 22, 2016, entitled "POWER GATING CIRCUIT UTILIZING DOUBLE-GATE FULLY DEPLETED SILICON-ON-INSULATOR TRANSISTOR." The entire contents of the above-identified application are expressly incorporated herein by reference, including the contents and teachings of any references contained therein.

FIELD

Aspects of the present invention generally relate to the field of power gating circuits, such as those utilized to manage power consumption and thermal stress in microprocessors and/or integrated circuits.

BACKGROUND

Power gating is a technique to manage leakage power during the standby mode in low-power and high-speed integrated circuits (ICs). Conventional power gating techniques utilize transistor-based switches (e.g., sleep transistors) to shut down part of the circuit block and put it in idle mode. Sleep transistors help ICs manage power and thermal effects efficiently. The total power consumption of the ICs is comprised of static, dynamic, and short-circuit effects. The dynamic behavior has an exponential effect on the power dissipation, and as a result, it leads to a higher temperature injection in the circuit node. In the static mode, temperature has an exponential effect on the leakage current. This interdependence of power and thermal impacts makes an efficient power gating circuit a very critical requirement for integrated circuits and systems.

Conventional sleep transistor based power gating techniques utilize one of the three approaches as shown in FIGS. 1A-1C. The first approach, illustrated by FIG. 1A, employs high threshold voltage (high-$V_t$) transistors between the supply lines and the circuit to create virtual $V_{dd}$ and $V_{ss}$ nodes at every cell that needs to be shut down or placed in a sleep mode. The high-$V_t$ sleep transistors are implemented in the form of a "header switch" and a "footer switch" to isolate the virtual supply nodes from the actual supply lines, as shown in FIG. 1A. The second approach, illustrated by FIG. 1B, utilizes only a "header switch" by connecting a high-$V_t$ transistor between the actual power rail and the virtual $V_{dd}$ node. And the third approach, illustrated by FIG. 1C, utilizes only a "footer" switch.

All of the above approaches are used to lower subthreshold current leakage. Other conventional techniques include a reconfigurable sleep transistor technique, a negative bias temperature instability (NBTI) aware sleep transistor design, and a sleep transistor inserted as part of a 3T DRAM cell to reduce leakage power. In all of these conventional approaches, low-$V_t$ transistors are used inside the logic circuits to ensure higher performance during the active mode of the circuit. High-$V_t$ sleep transistors are placed between the logic circuits and the supplies to reduce leakage power during the standby period. These sleep transistors used as "header" and/or "footer" switches impose extra area, delay, and power overheads. Additionally, the design complexity involved with the implementation of transistors with different threshold voltages in the same circuit makes these design techniques less appealing. Moreover, the additional wiring required for the virtual nodes introduces unwanted resistor, inductor, capacitor (RLC) issues and IR-drops causing voltage variations.

SUMMARY

Aspects of the invention relate to power-gating circuits that combine the functionality of sleep transistors with logic devices by utilizing fully depleted silicon-on-transistor (FD-SOI) devices. Beneficially, the FDSOI transistor-based power-gating circuit described herein eliminates the requirement of employing a separate set of sleep transistors to place the circuit in the sleep/idle mode. Eliminating the standalone sleep transistors reduces the overall complexity and overheads of integrated circuits and simplifies power gating techniques. Moreover, aspects of the present disclosure improve the overall power efficiency and reduce thermal effects. In the circuit design described herein, the flexibility to control the threshold voltage ($V_t$) of a double-gate FDSOI device via the back gate is utilized to eliminate the need for using a separate set of sleep transistors.

A system embodying aspects of the invention includes a back gate controller and a fully depleted silicon-on-insulator (FDSOI) transistor. The double-gate FDSOI transistor includes a front gate and a back gate. The back gate controller is configured to induce a bias in the back gate of the FDSOI transistor to dynamically set a threshold voltage value of the FDSOI transistor. In a sleep state, the FDSOI transistor is set to a high threshold voltage value and in an active state, the FDSOI transistor is set to a low threshold voltage value.

Other objects and features will be in part apparent and in part pointed out hereinafter.

BRIEF DESCRIPTION OF THE DRAWINGS

FIGS. 1A-1C illustrate conventional sleep transistor circuits.

Corresponding reference characters indicate corresponding parts throughout the drawings.

DETAILED DESCRIPTION

In conventional complementary metal-oxide semiconductor (CMOS) sleep transistor design, logic gates or blocks are connected to the power supplies through sleep transistors. These sleep transistors are controlled by signals generated by a central gate controller or distributed control logics. But centralized sleep transistor designs suffer from large interconnect resistances between distant blocks. Such resistance has to be compensated by an extra-large sleep transistor area. In the distributed and cluster-based designs of sleep transistors (as opposed to the centralized control approach), additional wiring is required. In accordance with an aspect of the present disclosure, the additional sleep transistors are completely eliminated, which provides 100% savings of the area overheads of the sleep transistors.

The additional wiring and the placement of additional sleep transistors (FIGS. 1A-1C) between the functional blocks and the power supplies result in a delay penalty in the conventional designs. In the absence of a sleep transistor, the propagation delay ($\tau_{pd}$) of a logic gate depends on the supply and threshold voltages. This dependency can be expressed by the Alpha Power law model as depicted in Equation (1), where $C_L$ is the load capacitance and $\alpha$ is the velocity saturation index, which is process specific. For simplicity, $\alpha$ is typically assumed to be 1 in short-channel devices.

$$T_{pd} = \frac{C_L V_{dd}}{(V_{dd} - V_{tL})^\alpha} \quad (1)$$

When a sleep transistor is present, a source drain voltage ($V_{sd}$) drop occurs causing the propagation delay to increase as shown in Equation (2).

$$T_{pd-MT} = \frac{C_L V_{dd}}{(V_{dd} - V_{sd} - V_{tL})^\alpha} \quad (2)$$

The performance loss (PL) due to the increase in propagation delay related to the sleep transistors is depicted by Equation (3).

$$PL = 1 - \frac{T_{pd}}{T_{pd-MT}} \quad (3)$$

The delay overhead depicted by Equation (3) is absent in power gating circuits in accordance with an aspect of the disclosure because of the elimination of sleep transistors.

Figure 2:
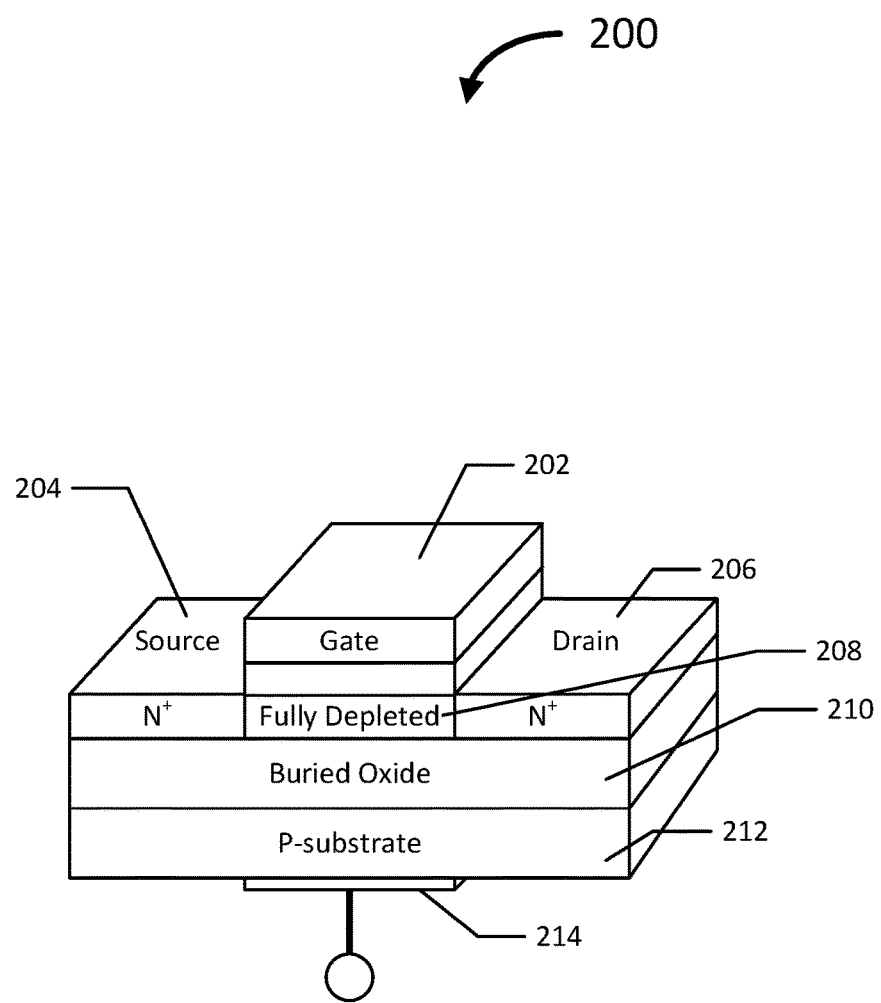
FIG. 2 illustrates an exemplary double-gate silicon-on-insulator (SOI) metal-oxide semiconductor field-effect transistor (MOSFET) according to an embodiment.

FIG. 2 illustrates a double-gate fully depleted silicon-on-insulator (FDSOI) transistor 200 adapted to perform both the functions of sleep transistors and logic devices, in accordance with an aspect of the disclosure. The FDSOI transistor 200 includes a front gate 202, a source 204, a drain 206, a body (i.e., fully depleted layer) 208, a buried oxide layer 210, a substrate layer 212, and a back gate 214. As illustrated, the back gate 214 is provided under the substrate layer 212. In an embodiment, FDSOI transistor 200 comprises a metal-oxide semiconductor field-effect transistor (MOSFET).

The FDSOI transistor 200 includes two gates (e.g., front gate 202 and back gate 214) that control the charges in the silicon channels. In an aspect, FDSOI transistor 200 differs from conventional approaches by the addition of a conductive under layer (e.g., back gate 214) beneath the SOI device. As depicted in FIG. 2, the body region of this SOI MOSFET is floating as opposed to a bulk MOSFET device, in which the body is inherently connected to the substrate. From a functional point of view, the FDSOI transistor 200 can be viewed as two MOSFETs (e.g., front and back MOSFETs) that share the same body, drain, and source regions. Although embodiments described herein utilize a fully depleted (FD) channel region (e.g., body) SOI MOSFET structure, one of ordinary skill in the art will understand that a partially depleted (PD) channel region is within the scope of the present disclosure. An exemplary advantage of FDSOI transistor 200 includes enhanced control of the back-gate on the channel. In an aspect of the PDSOI, the back gate or the substrate has very minor influence on the front surface and channel potential. In an aspect of FDSOI devices, the silicon film thickness is generally less than or equal to about half of the depletion width of the bulk device. Electrical parameters, including threshold voltage and drain current of the SOI devices, are influenced by the film thickness.

Since fully depleted SOI MOSFET threshold voltages are sensitive to the variations in SOI silicon film thickness, thin films are required in order to have enhanced control over the performance of a device. In addition, thinner SOI film thickness is required for the minimization of short-channel effects and elimination of the current kinks in the SOI MOSFETs. The surface potentials of FDSOI at the front and back interfaces are strongly coupled to each other and capacitively coupled to the front-gate and the substrate through the front-gate oxide and buried oxide, respectively.

The threshold voltage of a double-gate FDSOI can be modeled as in Equation (4) and Equation (5), where $V_t^f$ and $V_{BG}$ are the front threshold and back gate voltages, respectively, $V_{FB}^f$ and $V_{FB}^b$ are the front gate and back gate flatband voltages, respectively, $C_{ox}$, $C_{BOX}$, and $C_{si}$ are front and back gate oxide, and the buried oxide capacitance and depleted silicon film capacitances. $Q_b$ is the area charge density in the depleted silicon film.

$$V_t^f = \quad (4)$$
$$V_{FB}^f + 2\phi_B - \frac{Q_b}{2C_{Ox}} - \left(V_{BG} - V_{FB}^b - 2\phi_B + \frac{Q_b}{2C_{BOX}}\right) \cdot \frac{C_{si} C_{BOX}}{C_{ox}(C_{si} + C_{BOX})}$$

$$Q_b = -qN_A T_{si} \text{ or } + qN_D T_{si} \quad (5)$$

Figure 3:
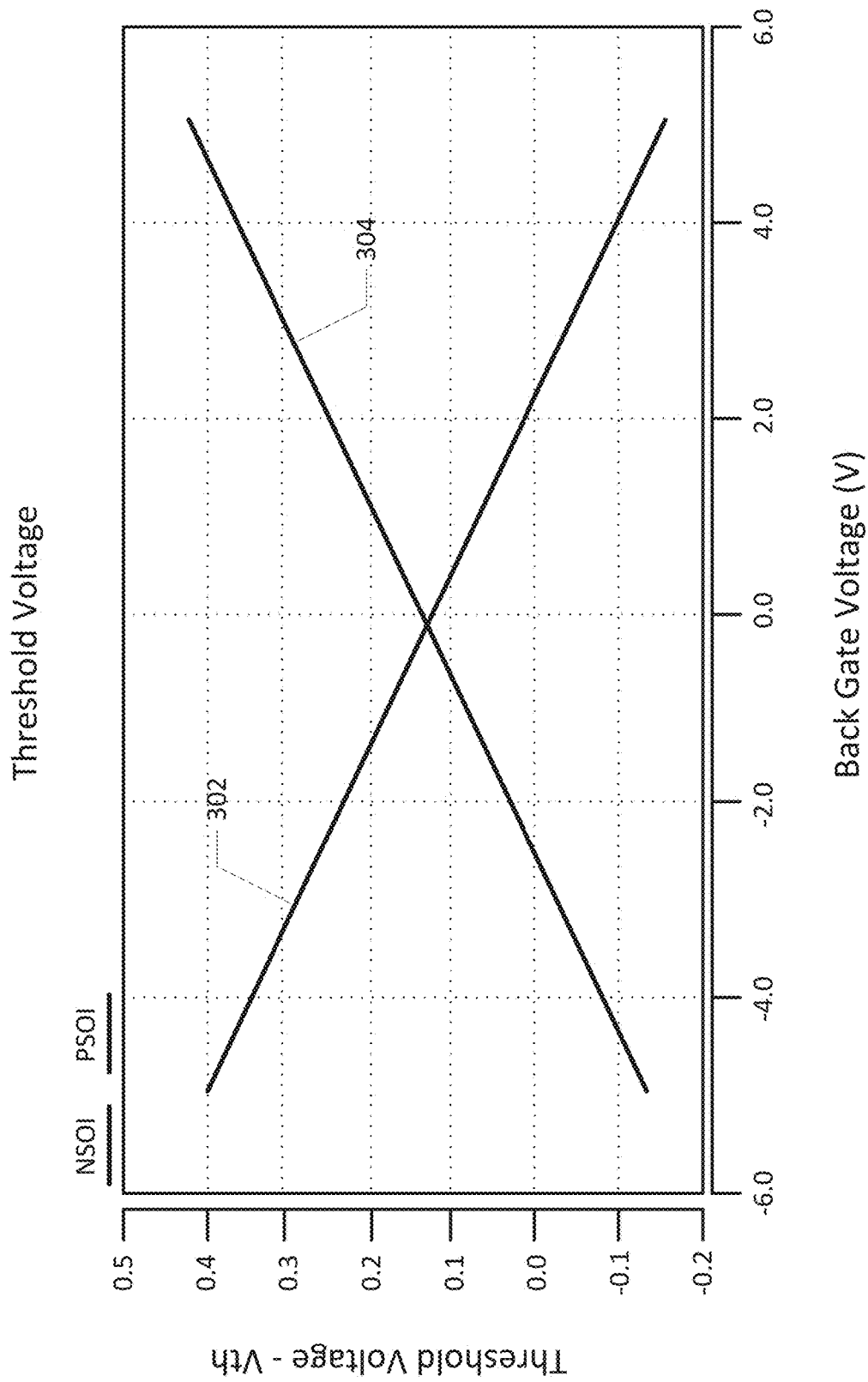
FIG. 3 illustrates an exemplary variation of threshold voltage with back gate bias according to an embodiment.

FIG. 3 shows the dependence of the threshold voltage on the back gate of the device for both n-type silicon on insulator (NSOI) (302) and p-type silicon on insulator (PSOI) (304) devices. In an embodiment, FDSOI transistor 200 controls subthreshold leakage by lowering the subthreshold swing (S) of the transistor. The FDSOI provides a lower value of S (e.g., between 65-80 mV/dec) and it can even be further improved by reducing η (DIBL or drain induced barrier) using the thin film ($T_{si}$) design. The achievable values of S in the conventional bulk MOSFET are between 90-120 mV/dec. The subthreshold swing S of FDSOI device is given by Equation (6), where $C_{it1,2}$ is interface-trap capacitance in the wafer process, which can dynamically be charged or discharged. In this device, the threshold voltage values can be controlled by applying a bias voltage at the back gate.

$$S_1^{dep} = 2.3 \frac{KT}{q}\left(1 + \frac{C_{it_1}}{C_{Ox1}} + \frac{C_{Ox2} + C_{it_2}}{C_{si} + C_{Ox2} + C_{it_2}} + \frac{C_{si}}{C_{Ox1}}\right) \quad (6)$$

Figure 4:
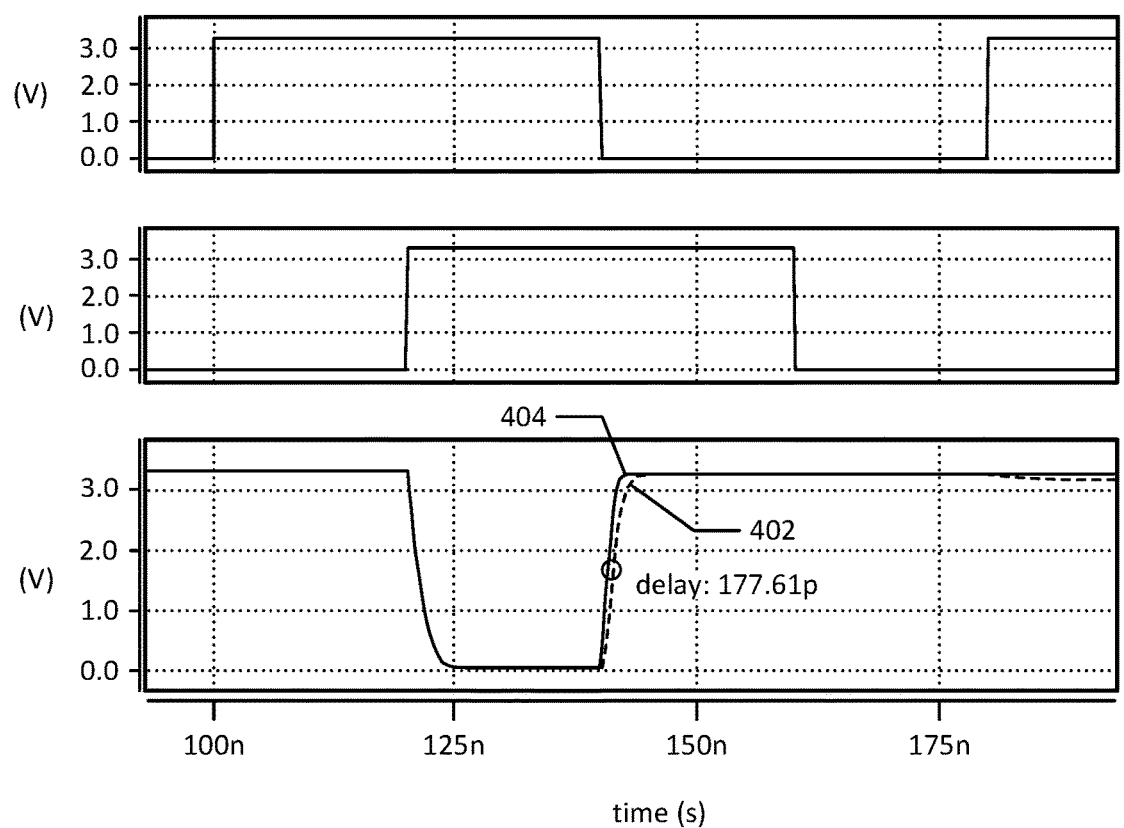
FIG. 4 illustrates an exemplary propagation delay incurred by a header switch transistor in a two-input NAND gate SOI FET design at a high threshold voltage according to an embodiment.

FIG. 4 illustrates a propagation delay incurred by a header switch (e.g., transistor) in a two-input NAND gate SOI FET design at high-$V_t$ in accordance with an embodiment of the disclosure. As illustrated, FIG. 4 depicts the output voltage (V) of a two-input NAND gate with header switch (402) with a solid line and without a header switch or back gate controlled design (404) with a dashed line. At a high threshold voltage setting, the proposed approach shows a 177.6 picosecond propagation delay improvement.

Figure 5:
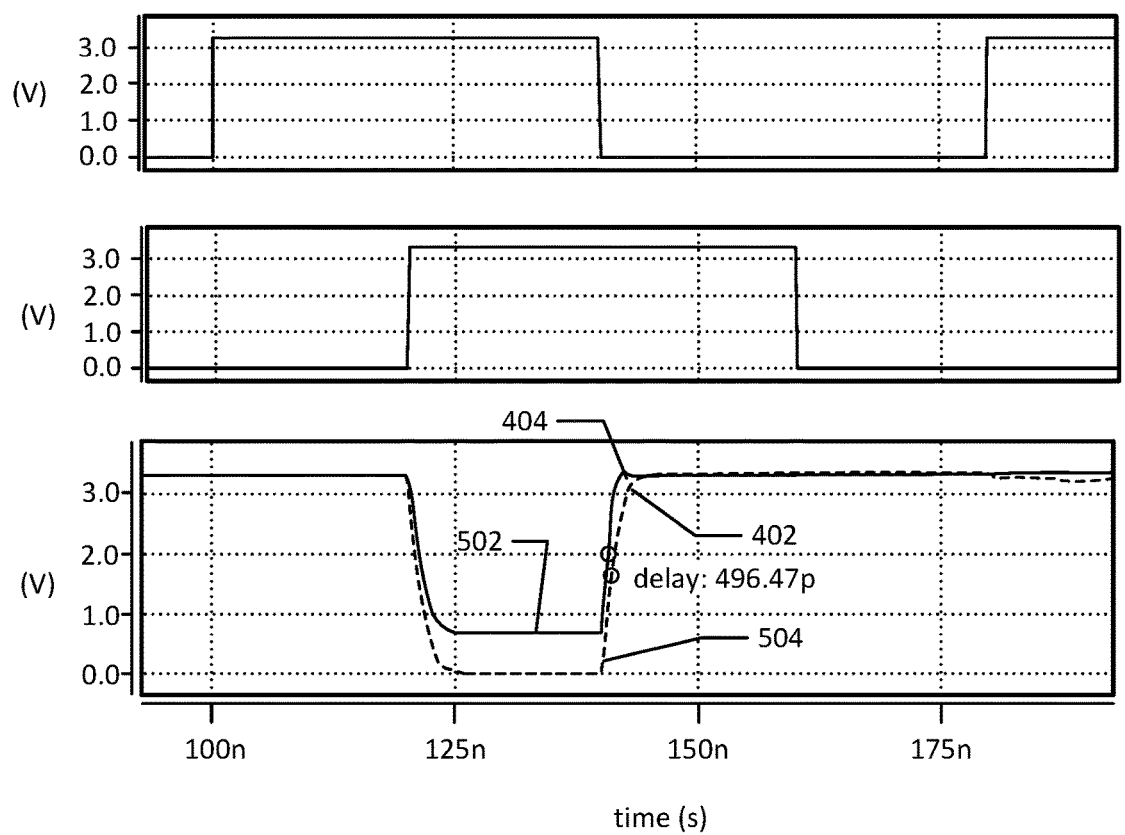
FIG. 5 illustrates an exemplary propagation delay incurred by a header switch transistor in a two-input NAND gate SOI FET design at a low threshold voltage according to an embodiment.

FIG. 5 illustrates a propagation delay incurred by a header switch (e.g., transistor) in a two-input NAND gate SOI FET design at low-$V_t$ in accordance with an embodiment of the disclosure. As illustrated, the output voltage of a circuit in accordance with the present disclosure (502) shown with a solid line can push the threshold voltage to a low setting and allow it to turn on quicker than one with a header switch (504) shown with a dashed line. An improvement of about 500 picoseconds is exhibited via dynamic threshold control. Additionally, the slope of the new circuit is much steeper, this is especially important for the transient response of the circuit in active mode. Details regarding dynamic control of the threshold voltage via the back gate are further described herein.

For faster operation in the active mode, a lower threshold voltage for the logic transistors is desired to provide a higher gate drive. For power savings in the standby mode, a higher threshold voltage in the sleep transistors is desired because higher threshold voltage leads to exponential reduction of the subthreshold current, which is the primary source of standby power. Since the same set of transistors perform both the functions (of logic and sleep transistors) in accordance with an aspect of the disclosure, the ability to dynamically set lower and higher values of threshold voltage in the same transistors is required. This can be done in a double-gate SOI device. The flexibility of the double-gate SOI devices provides the ability to dynamically set the threshold voltage to an appropriate level for both active (e.g., a first value or level) and standby (e.g., a second value or level) modes. In an embodiment, the threshold voltage of the double-gate SOI device is set to a first value that corresponds to an active mode. The double-gate SOI operates at the first threshold voltage value while in the active mode. The threshold voltage of the double-gate SOI can be dynamically adjusted to a second value that corresponds to a sleep mode. The double-gate SOI then operates at the second threshold voltage value during the sleep mode. In one form, the threshold voltage is initially at a value (e.g., a third value) that is higher than the first value. In this form, the setting of the threshold voltage comprises reducing the threshold from the third value to the first value in order to achieve faster operation of the double-gate SOI device while in the active mode. In another form, the dynamic adjustment of the threshold voltage comprises dynamically increasing the threshold voltage from the first value to the second value to achieve power savings of the double-gate SOI device in the sleep mode. Moreover, utilizing a SOI device beneficially results in enhanced performance (e.g., high speed, low power consumption, radiation-hardness, etc.), higher scalability, improved noise immunity, lower parasitic capacitances, and higher yield.

Figure 6:
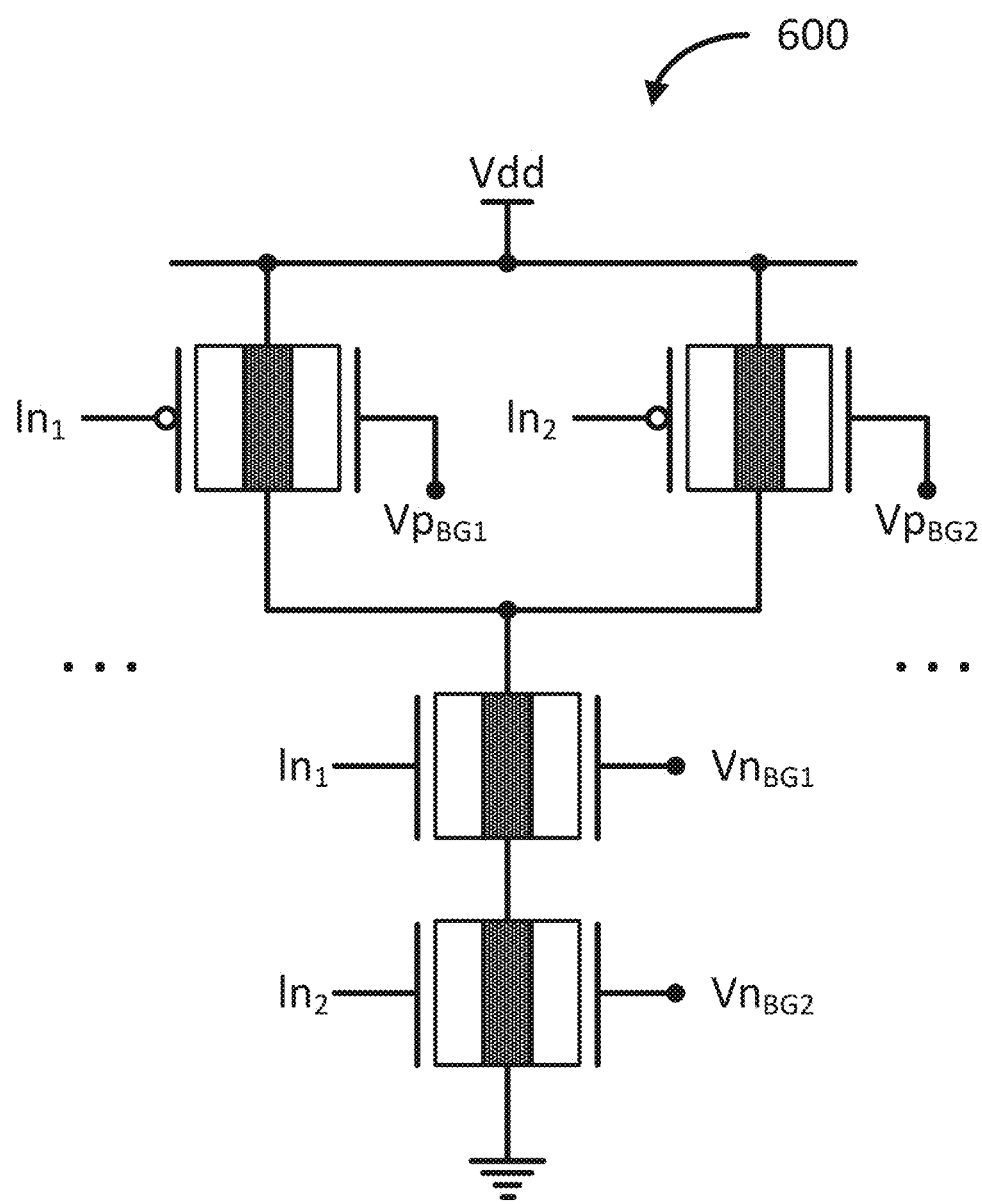
FIG. 6 illustrates an exemplary two-input NAND gate in which the same set of transistors perform both sleep and logic functions according to an embodiment.

FIG. 6 illustrates an exemplary two-input NAND gate 600 in accordance with an aspect of the disclosure, in which the same set of transistors are utilized for sleep and logic functions by replacing conventional bulk MOSFET transistors by a double-gate FDSOI transistor. The front gates of all of the transistors of FIG. 6 are connected to appropriate voltage supplies, while the back gates are connected to a centralized back gate controller (BCR). In another embodiment, the double-gate FDSOI is managed by distributed control logic components in the same manner conventional sleep transistors are connected and controlled. Advantageously, the illustrated two-input NAND gate in accordance with an aspect of the disclosure does not need the additional sleep transistor because the back-gate MOSFET within the double-gate FDSOI device structure will perform this function. Different levels of $I_{on}$ current can be specified based on the effective bias at the back gates of the transistors. In the active mode, higher $I_{on}$ current can be set for faster operation. In the standby mode, the transistors can be set to low-current and low-power mode dynamically. In an embodiment, the high and low current values are relative to the application. For example, a microampere current may be a low (e.g., off) current in some applications and a very high current in other applications (e.g., low-power applications, etc.). In another embodiment, the high and low current values are relative to the size of the device and technology node (e.g., see FIGS. 7 and 8).

The subthreshold leakage current in a MOSFET device can be modeled as in Equations (7)-(9). These equations are slightly modified to represent the back gate bias voltage.

$$I_{leakage} = I_0 e^{\frac{V_{GS}-V_{THf}-\eta V_{DS}+\gamma V_{BS}}{nV_T}}\left(1 - e^{\frac{-V_{DS}}{V_T}}\right) \quad (7)$$

$$I_{leakage} = I_0 e^{\frac{V_{GS}-V_{THf}-\eta V_{DS}+\gamma V_{BS}}{S}}\left(1 - e^{\frac{-V_{DS}}{V_T}}\right) \quad (8)$$

$$I_0 = \mu C_{ox}\frac{W}{L}V_T^2 e^{1.8} \text{ and } V_T = \frac{KT}{q} \quad (9)$$

Here $V_{GS}$, $V_{DS}$, and $V_{BS}$ are the gate to source, drain to source, and bulk to source voltages, respectively, and μ denotes the carrier mobility. $C_{ox}$ is the gate oxide capacitance, W and L denote the channel width and length of the 501 MOSFET, K is the Boltzmann constant, T is the absolute temperature, q is the electrical charge of an electron, $V_T$ is the thermal voltage, $V_{THf}$ is the threshold voltage at the front gate (as a function of the bias voltage), γ is the body effect coefficient, η denotes the drain induced barrier lowering coefficient, n is the subthreshold swing coefficient, and S is the subthreshold swing (as in Equation 6).

Figure 7:
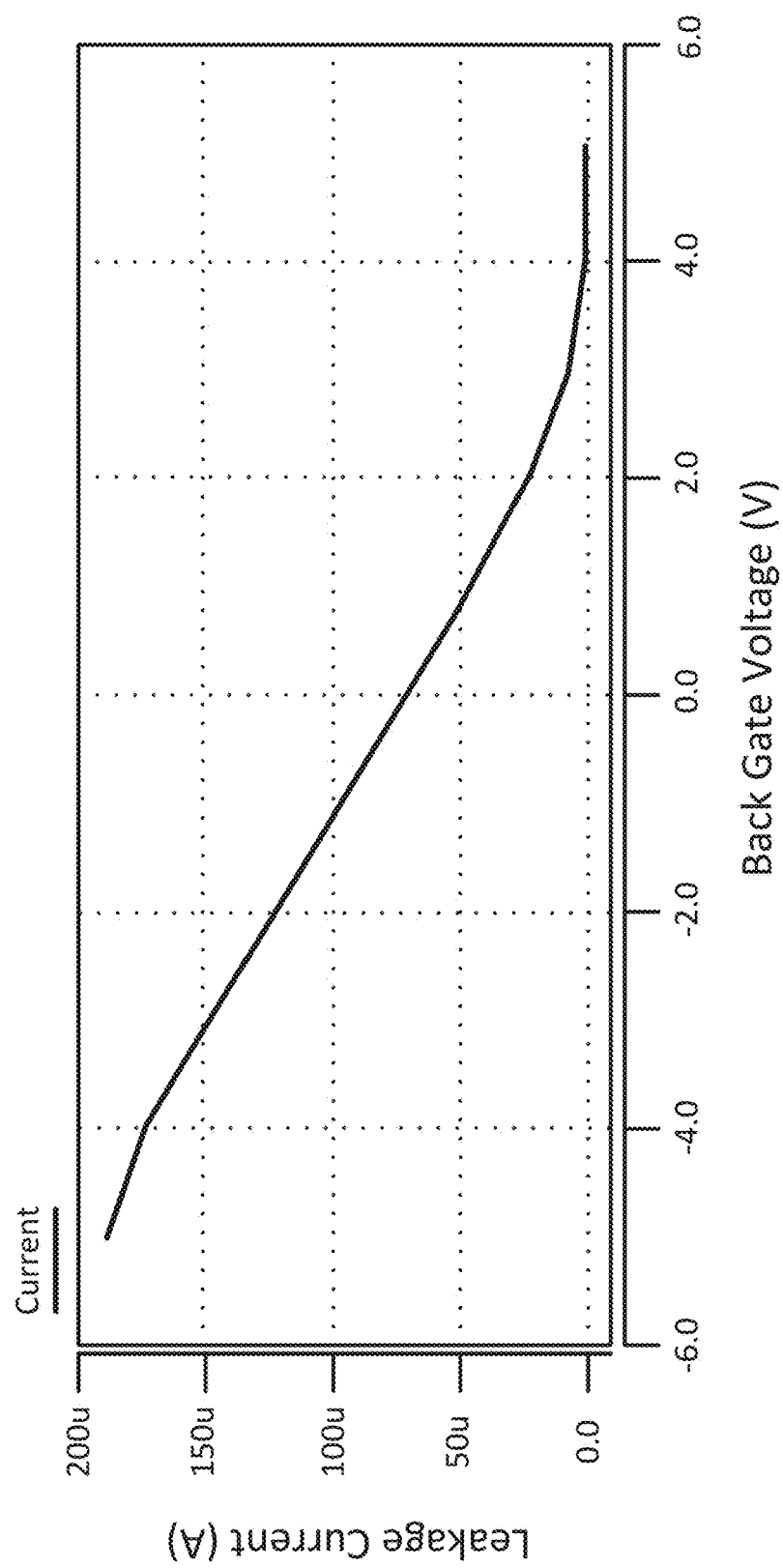
FIG. 7 illustrates an exemplary variation of leakage current with back gate voltage according to an embodiment.
Figure 8:
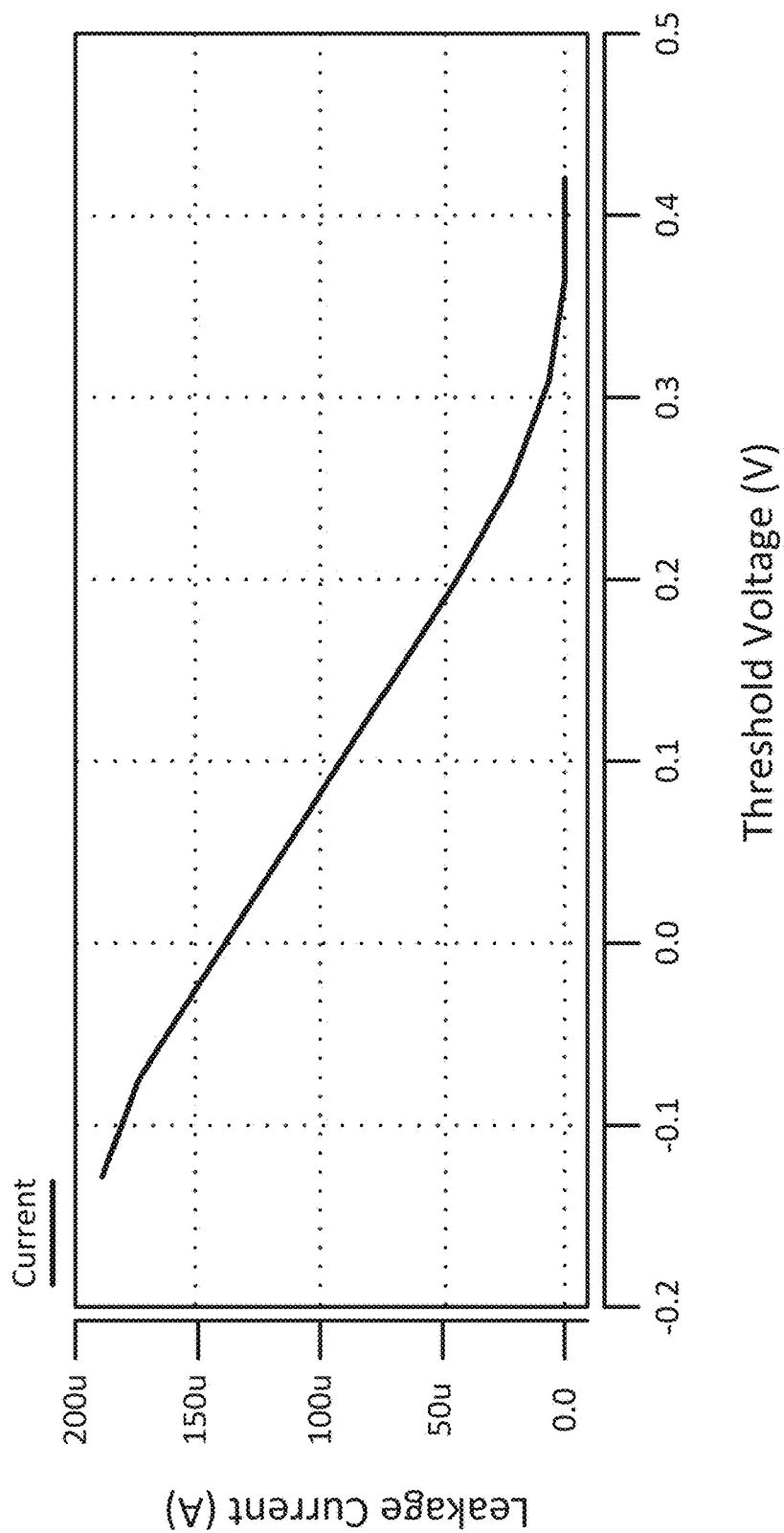
FIG. 8 illustrates an exemplary relation between leakage current and threshold voltage according to an embodiment.
Figure 9:
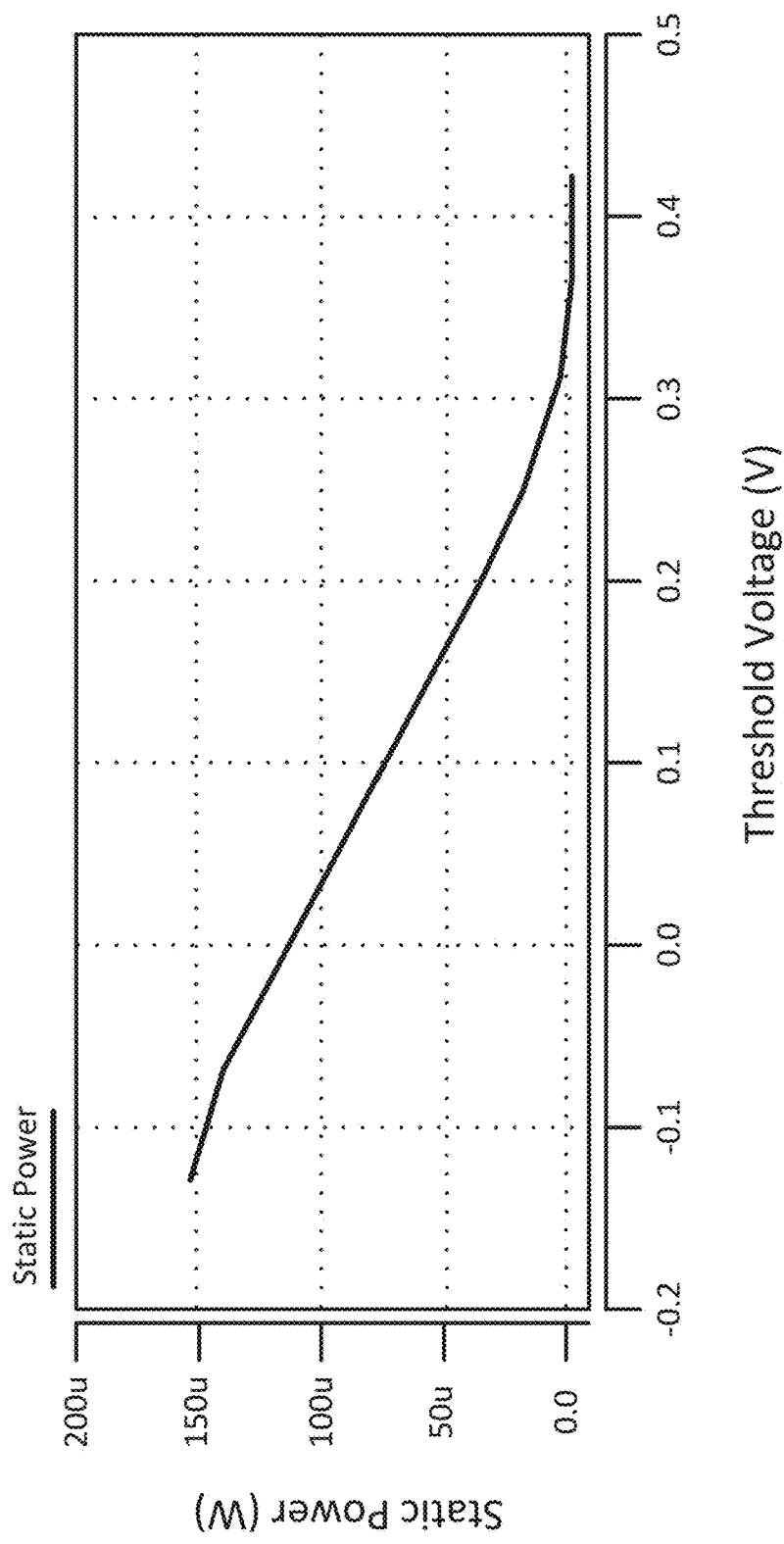
FIG. 9 illustrates an exemplary relation between threshold voltage and standby power according to an embodiment.
Figure 10:
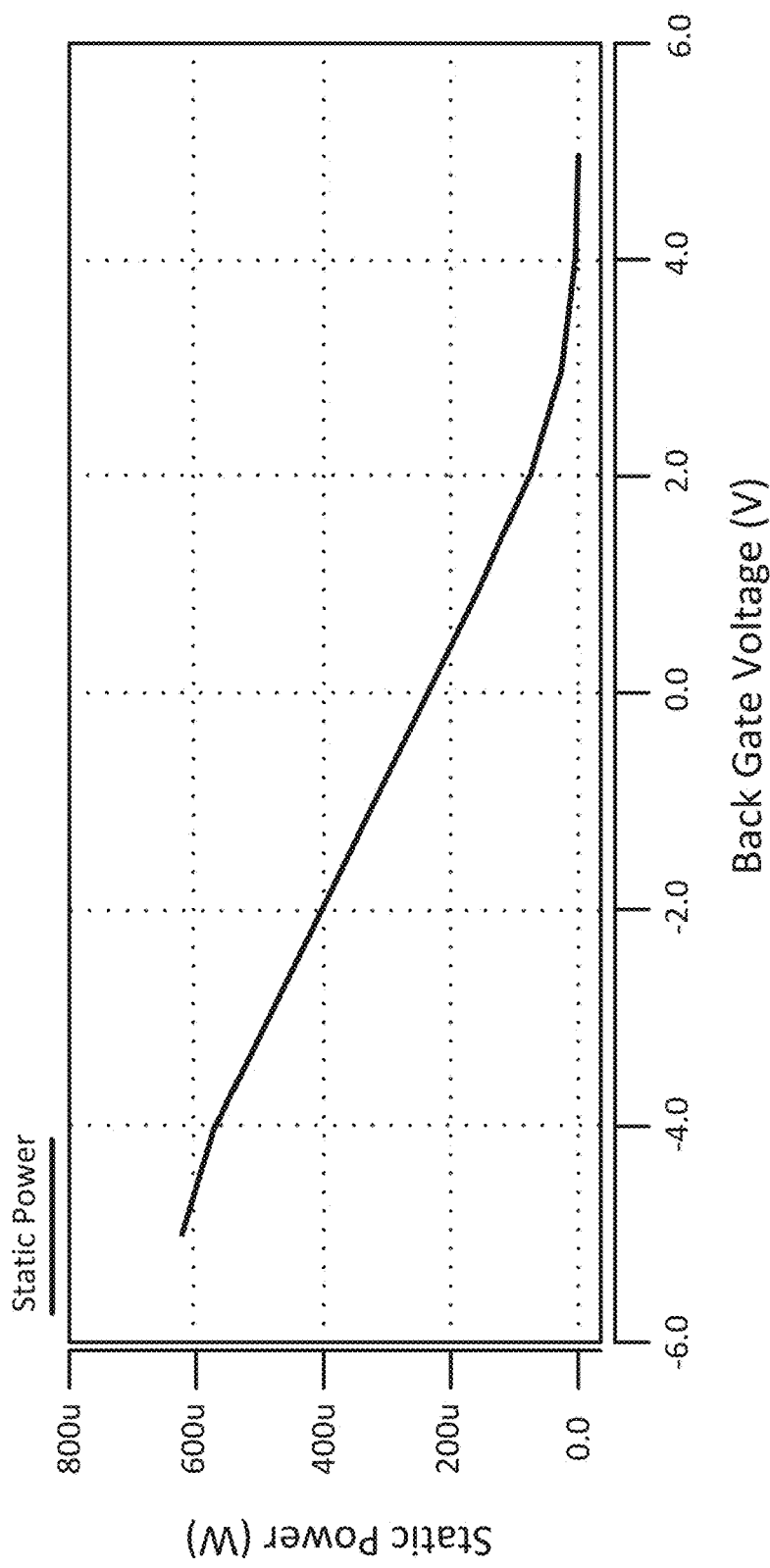
FIG. 10 illustrates an exemplary relation between back gate voltage and standby power according to an embodiment.

For the two-input NAND sleep transistor circuit 600 in accordance with an aspect of the disclosure, various Hspice simulations were performed and the results are presented in FIGS. 7-10. FIG. 7 shows the variation of the leakage current with the back gate voltage. The correlation between the threshold voltage and leakage current is shown in FIG. 8. As depicted by FIGS. 7 and 8, by setting a proper value of the threshold voltage through the back-gate, an acceptable level of leakage current can be set for the standby mode. The subthreshold leakage current is the dominant source of static or standby power dissipation. FIGS. 9 and 10 show the change in standby power with the change of the threshold voltage and back gate bias, respectively. Therefore, by properly adjusting the back gate bias it is possible to control the standby power dissipation in the circuit 600 depicted in FIG. 6 for a two-input NAND gate.

Figure 11A:
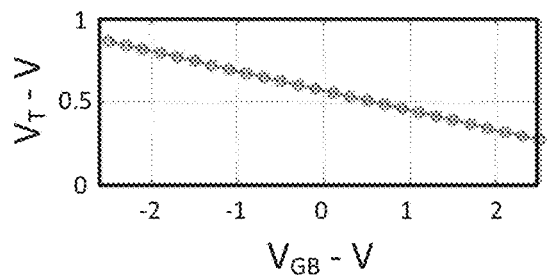
FIG. 11A illustrates an exemplary threshold voltage relative to back gate bias according to an embodiment.
Figure 11B:
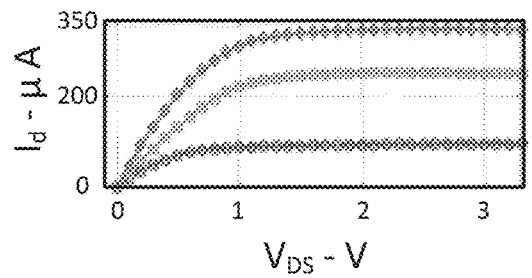
FIG. 11B illustrates exemplary drain currents with respect to drain voltage and back gate bias according to an embodiment.
Figure 11C:
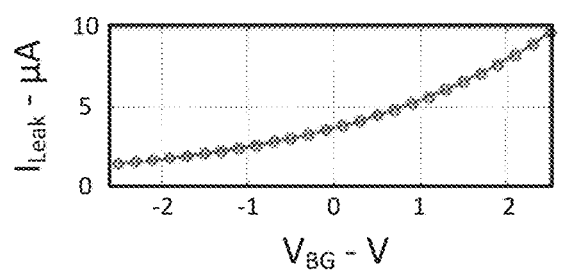
FIG. 11C illustrates an exemplary leakage current relative to back gate voltage according to an embodiment.
Figure 11D:
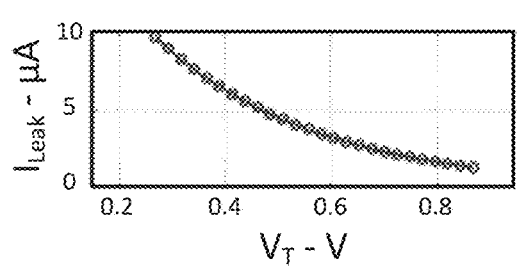
FIG. 11D illustrates an exemplary leakage current relative to threshold voltage according to an embodiment.
Figure 11E:
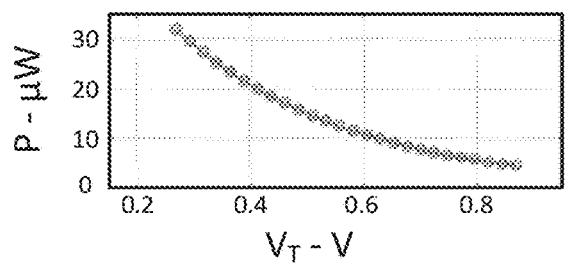
FIG. 11E illustrates an exemplary threshold voltage relative to static power according to an embodiment.
Figure 11F:
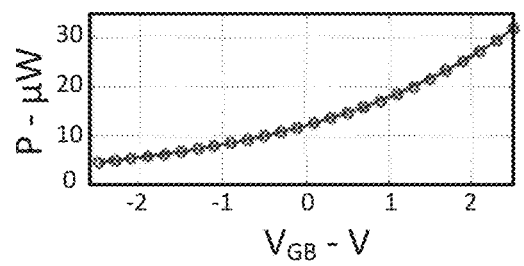
FIG. 11F illustrates an exemplary back gate voltage relative to static power according to an embodiment.

Before implementing the design on Hspice, the sleep transistor design in accordance with an aspect of the present disclosure was first simulated and verified on MATLAB. The equations provided above from (4) to (9) are used to base the foundation for the design approach. The simulation results for the preliminary analysis are presented in FIGS. 11A-11F. The input voltages as well as some of the device parameters are not the same with the Hspice design. Also, some of the equations were simplified to facilitate the coding. FIG. 11A shows threshold dependency of NSOI by varying the back gate voltage. FDSOI can be viewed and modeled as two FETs with two gates that control the charges in the silicon channels (FIG. 11B). This allows the designer to accurately modulate the Ion current to increase and Ioff current to decrease dynamically. FIGS. 11C and 11D are very critical, especially to sleep transistor design. The figures show the flexibility of FDSOI to the back bias voltage in determining the leakage current. FIGS. 11E and 11F illustrate the correlation between high and low threshold voltage and their role when it comes to static power dissipation.

In one form, aspects of the disclosure provide an approach to mitigate static power consumption using double-gate FDSOI transistors. In an embodiment, sleep transistor characteristics are controlled via back-gate bias. This approach simplifies design complexity, reduces chip area, improves power dissipation, and lowers thermal effects in the circuit. Beneficially, transistors in accordance with the present disclosure reduce performance loss due to propagation delay caused by additional transistors between the low-$V_t$ logic blocks and voltage supply line. The approach described herein incorporates the sleep transistor design as part of the circuit design and avoids the standalone complex design technique. Moreover, aspects of the present disclosure provide a dynamically controlled $V_t$ for circuits that need to be switched between a sleep state and an active state.

A system embodying aspects of the invention includes a back gate controller and a fully depleted silicon-on-insulator (FDSOI) transistor (200). The double-gate FDSOI transistor includes a front gate (202) and a back gate (214). The back gate controller is configured to induce a bias in the back gate of the FDSOI transistor to dynamically set a threshold voltage value of the FDSOI transistor. In a sleep state, the FDSOI transistor is set to a high threshold voltage value and in an active state, the FDSOI transistor is set to a low threshold voltage value.

In one form, the back gate is arranged beneath the FDSOI transistor. In another form, the system further includes a source (204), a drain (206), a fully depleted layer (208), a buried oxide layer (210), and a substrate layer (212). In yet another form, the fully depleted layer is arranged between the buried oxide layer and the front gate, the buried oxide layer is arranged between the fully depleted layer and the substrate layer, and the substrate layer is arranged between the buried oxide layer and the back gate. In another form, the substrate layer is a silicon thin film. In yet another form, a body region (e.g., fully depleted layer) is floating. In another form, the back gate controller is configured to set a high $I_{on}$ current for the active state and a low $I_{on}$ current for the sleep state. In yet another form, the FDSOI transistor is a metal-oxide semiconductor field-effect transistor (MOSFET) that is configured to perform logic operations on input voltages when the FDSOI MOSFET is in the active state and the back gate is configured to switch the FDSOI MOSFET between the active state and an idle state.

A method embodying aspects of the invention includes setting a threshold voltage of a logic transistor (200) at a first value that corresponds to an active mode. The logic transistor is operated at the first threshold voltage value during the active mode. The method further includes dynamically adjusting the threshold voltage of the logic transistor to a second value that corresponds to a sleep mode. The logic transistor is then operated at the second threshold voltage value during the sleep mode.

In one form, setting the threshold voltage value comprises reducing the threshold voltage from a third value that his higher than the first value. The threshold voltage is reduced from the third value to the first value to achieve faster operation of the logic transistor in the active mode. In another form, the dynamic adjustment of the threshold voltage comprises dynamically increasing the threshold voltage from the first value to the second value to achieve power savings of the logic transistor in the sleep mode. In yet another form, the logic transistor is a double-gate fully depleted silicon-on-insulator (FDSOI) transistor. In another form, the FDSOI transistor is a MOSFET.

A logic circuit embodying aspects of the invention includes an integrated power gating circuit. The power gating circuit includes a transistor (200) that has a plurality of threshold voltage values. The transistor is configured to perform logic operations on input voltages at a first threshold value when in an active state and configured to switch from the active state to an idle state. The idle state has a second threshold value that is different than the first threshold value.

In one form, the transistor includes a back gate (214) that is configured to switch the transistor from the active state to the idle state. In another form, the back gate is arranged beneath the transistor. In yet another form, the transistor includes a front gate (202) arranged on top of the transistor such that the front gate and the back gate comprise opposite sides of the transistor. In another form, the transistor is a double-gate fully depleted silicon-on-insulator (FDSOI) transistor. In yet another form, the FDSOI transistor is a MOSFET.

When introducing elements of aspects of the invention or the embodiments thereof, the articles "a", "an", "the" and "said" are intended to mean that there are one or more of the elements. The terms "comprising", "including", and "having" are intended to be inclusive and mean that there may be additional elements other than the listed elements.

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. A power-gating circuit configured for use in an integrated circuit, the power gating circuit comprising:
   a back gate controller; and
   a double gate fully depleted silicon-on-insulator (FDSOI) transistor configured for performing logic functions on one or more input voltages of the integrated circuit when the FDSOI transistor is in an active state and for selectively placing at least a portion of the integrated circuit in a low power mode when the FDSOI transistor is in a sleep state, the FDSOI transistor having a front gate and a back gate,
   wherein the back gate controller is configured to induce a bias in the back gate of the FDSOI transistor to dynamically set a threshold voltage value of the FDSOI transistor, wherein the FDSOI transistor is set to a high threshold voltage value in the sleep state thereof,
   wherein the FDSOI transistor is set to a low threshold voltage value in an active state thereof, and
   wherein the threshold voltage of the FDSOI transistor is modeled based on a back gate voltage and on one or more of front gate and back gate flatband voltages, oxide capacitances, depleted silicon film capacitances, and an area charge density.

2. The power-gating circuit of claim 1, further comprising:
   a source;
   a drain;
   a fully depleted layer;
   a buried oxide layer; and
   a silicon thin film.

3. The power-gating circuit of claim 2, wherein the fully depleted layer is arranged between the buried oxide layer and the front gate, wherein the buried oxide layer is arranged between the fully depleted layer and the silicon thin film, and wherein the silicon thin film is arranged between the buried oxide layer and the back gate.

4. The power-gating circuit of claim 1, wherein a body region of the FDSOI transistor is floating.

5. The power-gating circuit of claim 1, wherein the back gate controller is configured to set a high $I_{on}$ current for the active state, and wherein the back gate controller is configured to set a low $I_{on}$ current for the sleep state.

6. The power-gating circuit of claim 1, wherein the FDSOI transistor comprises a metal-oxide semiconductor field-effect transistor (MOSFET), the MOSFET configured to perform logic operations on input voltages when the MOSFET is in the active state and the back gate configured to switch the MOSFET between the active state and the sleep state.

7. The power-gating circuit of claim 1, wherein the FDSOI transistor controls subthreshold leakage by lowering a subthreshold swing (S) thereof.

8. The power-gating circuit of claim 7, wherein the subthreshold swing (S) is given based on factors comprising: an interface-trap capacitance $C_{it1,2}$; a front and back gate oxide capacitance $C_{ox}$; the depleted silicon film capacitances $C_{si}$; the Boltzmann constant K; absolute temperature T; and the electrical charge of an electron q.

9. The power-gating circuit of claim 7, wherein a subthreshold leakage current of the transistor is modeled based on a plurality of factors comprising: FDSOI gate to source voltage $V_{GS}$; FDSOI drain to source voltage $V_{DS}$; FDSOI bulk to source voltage $V_{BS}$; carrier mobility µ; gate oxide capacitance $C_{ox}$; channel width and length W and L; Boltzmann constant K; absolute temperature T; electrical charge of an electron q; thermal voltage $V_T$; threshold voltage $V_{THF}$ at the front gate; body effect coefficient γ; drain induced barrier lowering coefficient η; subthreshold swing coefficient n; and the subthreshold swing S.

10. A method comprising:
    modeling a threshold voltage of a logic transistor of an integrated circuit based on a back gate voltage and on one or more of front gate and back gate flatband voltages, oxide capacitances, depleted silicon film capacitances, and an area charge density, wherein the logic transistor comprises a double-gate fully depleted silicon-on-insulator (FDSOI) transistor having a front gate and a back gate;
    setting the threshold voltage of the logic transistor at a first value, the first value corresponding to an active mode;
    operating the logic transistor at the first value during the active mode to perform logic functions on one or more input voltages of the integrated circuit;
    dynamically adjusting the threshold voltage of the logic transistor to a second value, the second value corresponding to a sleep mode, wherein said dynamically adjusting the threshold voltage comprises dynamically increasing the threshold voltage from the first value to the second value; and
    operating the logic transistor at the second value during the sleep mode to selectively place at least a portion of the integrated circuit in a low power mode when the logic transistor is in the sleep mode to achieve power savings of the integrated circuit.

11. The method of claim 10, wherein said setting the threshold voltage value comprises reducing the threshold voltage to the first value to achieve faster operation of the logic transistor in the active mode.

12. The method of claim 10, wherein the FDSOI transistor comprises a FDSOI metal-oxide semiconductor field-effect transistor (MOSFET).

13. The method of claim 10, further comprising controlling a subthreshold leakage of the FDSOI transistor by lowering a subthreshold swing (S) thereof.

14. The method of claim 13, wherein the subthreshold swing (S) is given based on factors comprising $C_{it1,2}$, an interface-trap capacitance in the wafer process; $C_{ox}$, the front and back gate oxide; $C_{si}$, the depleted silicon film capacitances; K, the Boltzmann constant; T, the absolute temperature; and q, the electrical charge of an electron.

15. The method of claim 10, further comprising modeling a subthreshold leakage current of the transistor based on a plurality of factors comprising: FDSOI gate to source voltage $V_{GS}$; FDSOI drain to source voltage $V_{DS}$; FDSOI bulk to source voltage $V_{BS}$; carrier mobility µ; gate oxide capacitance $C_{ox}$; channel width and length W and L; Boltzmann constant K; absolute temperature T; electrical charge of an electron q; thermal voltage $V_T$; threshold voltage $V_{THF}$ at the front gate; body effect coefficient γ; drain induced barrier lowering coefficient η; subthreshold swing coefficient n; and the subthreshold swing S.

16. A logic circuit comprising an integrated power gating circuit, the power gating circuit comprising a transistor having a plurality of threshold voltage values, the transistor comprising a double-gate fully depleted silicon-on-insulator (FDSOI) transistor having a front gate and a back gate, the transistor configured to perform logic operations of the logic circuit on input voltages at a first threshold value when in an active state and configured to switch from the active state to an idle state having a second threshold value different than the first threshold value to selectively place at least a portion of the logic circuit in a low power mode, wherein the input is dynamically increased from the first threshold value to the second threshold value to achieve power savings of the logic circuit in the idle state, wherein the threshold voltages are modeled based on a back gate voltage and on one or more of front gate and back gate flatband voltages, oxide capacitances, depleted silicon film capacitances, and an area charge density in the depleted silicon.

17. The logic circuit of claim 16, wherein the back gate is configured to switch the transistor from the active state to the idle state.

18. The logic circuit of claim 16, wherein the front gate is arranged on top of the transistor such that the front gate and the back gate comprise opposite sides of the transistor.

19. The logic circuit of claim 16, wherein the FDSOI transistor comprises a FDSOI metal-oxide semiconductor field-effect transistor (MOSFET).

20. The logic circuit of claim 16, wherein the FDSOI transistor controls subthreshold leakage by lowering a subthreshold swing (S) thereof.

21. The logic circuit of claim 20, wherein the subthreshold swing (S) is given based on factors comprising: an interface-trap capacitance $C_{it1,2}$; a front and back gate oxide capacitance $C_{ox}$; the depleted silicon film capacitances $C_{si}$; the Boltzmann constant K; absolute temperature T; and the electrical charge of an electron q.

22. The method of claim 16, wherein a subthreshold leakage current of the transistor is modeled based on a plurality of factors comprising: FDSOI gate to source voltage $V_{GS}$; FDSOI drain to source voltage $V_{DS}$; FDSOI bulk to source voltage $V_{BS}$; carrier mobility µ; gate oxide capacitance $C_{ox}$; channel width and length W and L; Boltzmann constant K; absolute temperature T; electrical charge of an electron q; thermal voltage $V_T$; threshold voltage $V_{THF}$ at the front gate; body effect coefficient γ; drain induced barrier lowering coefficient η; subthreshold swing coefficient n; and the subthreshold swing S.

* * * * *